United States Patent
Mei et al.

(10) Patent No.: US 7,498,794 B1
(45) Date of Patent: Mar. 3, 2009

(54) METHOD AND SYSTEM FOR SENSING CURRENT INDEPENDENTLY OF VARIATIONS IN OPERATING CONDITIONS

(75) Inventors: Tawen Mei, Mountain View, CA (US); Thomas Yang, Milpitas, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 240 days.

(21) Appl. No.: 11/486,519

(22) Filed: Jul. 13, 2006

(51) Int. Cl.
*G05F 3/08* (2006.01)
*G05F 1/565* (2006.01)

(52) U.S. Cl. .................. 323/312; 323/314; 323/317; 327/72; 327/540

(58) Field of Classification Search .............. 323/304, 323/311, 312, 349, 350, 223, 277, 313, 314, 323/317, 908; 327/53, 68, 72, 108, 512, 327/513, 427, 538, 539, 540, 541
See application file for complete search history.

(56) References Cited

U.S. PATENT DOCUMENTS

| | | | |
|---|---|---|---|
| 5,079,456 A | 1/1992 | Kotowski et al. | |
| 5,084,668 A | 1/1992 | Kotowski et al. | |
| 5,646,520 A | 7/1997 | Frank et al. | |
| 5,917,319 A | 6/1999 | Frank et al. | |
| 6,304,108 B1 * | 10/2001 | Inn | 327/72 |
| 6,600,362 B1 | 7/2003 | Gavrila | |
| 6,727,745 B2 | 4/2004 | Shearon et al. | |

OTHER PUBLICATIONS

S. Yuvarajan et al., "Performance Analysis and Signal Processing in a Current Sensing Power MOSFET (SENSEFET)", 1991 IEEE, pp. 1445-1450.
D.A. Grant et al., "Current Sensing MOSFETS for Protection and Control", 5 pages.
Marco Bildgen, "From Standard to Intelligent MOSFET", Jan. 1992 IEEE, pp. 1212-1217.
S. Yuvarajan et al., "Power Conversion and Control Using A Current Sensing Power MOSFET", 1992 IEEE, pp. 166-169.

* cited by examiner

*Primary Examiner*—Gary L Laxton

(57) ABSTRACT

A method for sensing current independently of variations in operating conditions is provided that includes generating a switch signal at a switching element. A reference signal is generated at a reference signal generator that is operable to track the switching element. A sense signal is generated based on the switch signal. An output current of the switching element is sensed based on a difference between the reference signal and the sense signal.

16 Claims, 3 Drawing Sheets

METHOD AND SYSTEM FOR SENSING CURRENT INDEPENDENTLY OF VARIATIONS IN OPERATING CONDITIONS

TECHNICAL FIELD OF THE INVENTION

The present invention relates generally to power supplies and, more particularly, to a method and system for sensing current independently of variations in operating conditions.

BACKGROUND OF THE INVENTION

The ability to sense switch current is generally a requirement in switching regulators. However, the resistance of the switch in a typical switching regulator is dependent on the over-drive voltage, temperature and processing. As a result, the current sensor for the switching regulator is unable to accurately sense current when these operating conditions vary too much. In many systems, this inaccuracy may be intolerable due to system requirements.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; "each" means every one of at least a subset of the identified items; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future, uses of such defined words and phrases.

BRIEF DESCRIPTION OF THE DRAWINGS

For a more complete understanding of the present invention and its advantages, reference is now made to the following description taken in conjunction with the accompanying drawings, wherein like reference numerals represent like parts, in which.

DETAILED DESCRIPTION OF THE INVENTION

Figure 1:
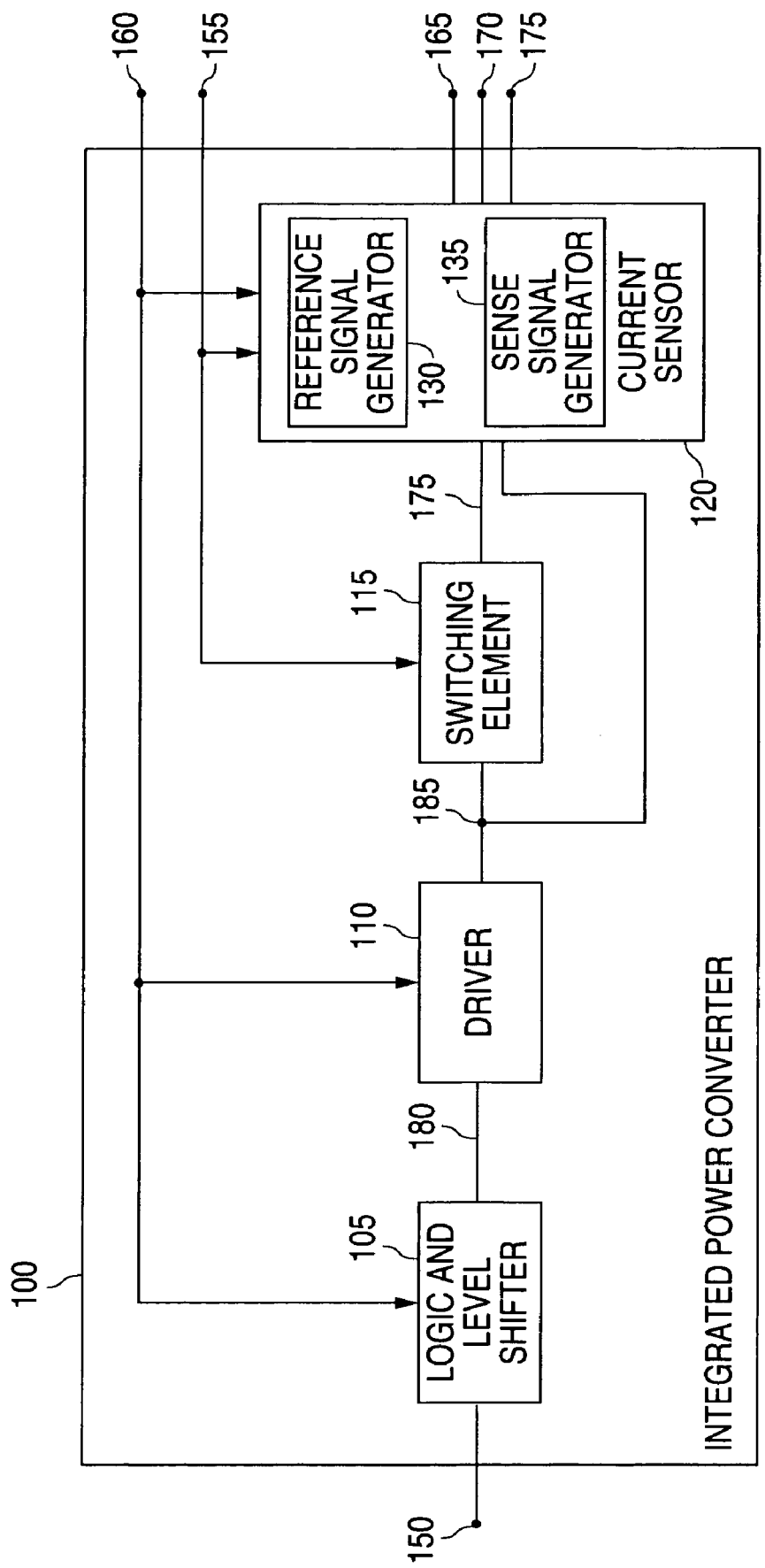
FIG. 1 is a block diagram illustrating an integrated power converter operable to sense current independently of variations in operating conditions in accordance with one embodiment of the present invention.
Figure 2:
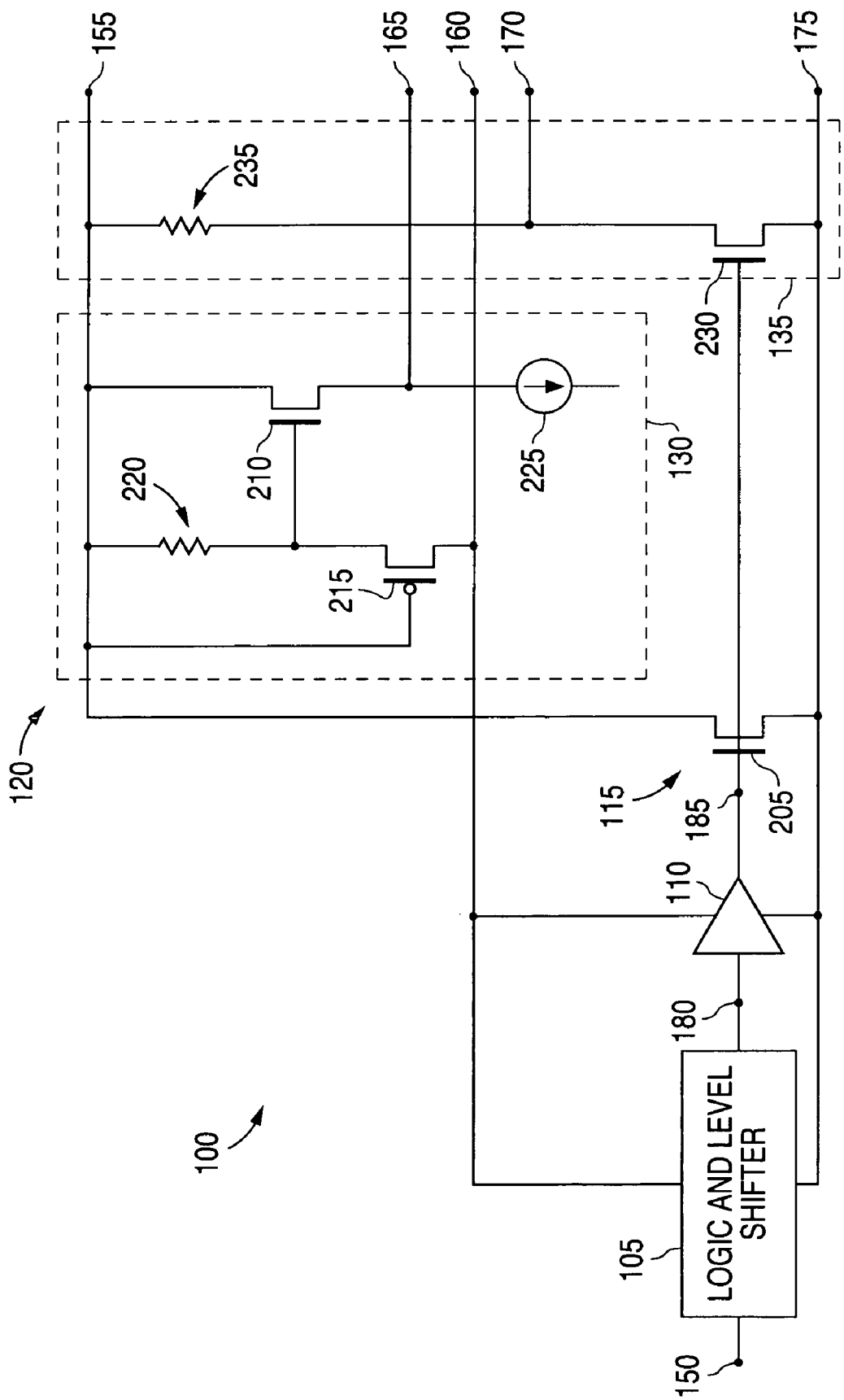
FIG. 2 is a circuit diagram illustrating details of the integrated power converter of FIG. 1 in accordance with one embodiment of the present invention.
Figure 3:
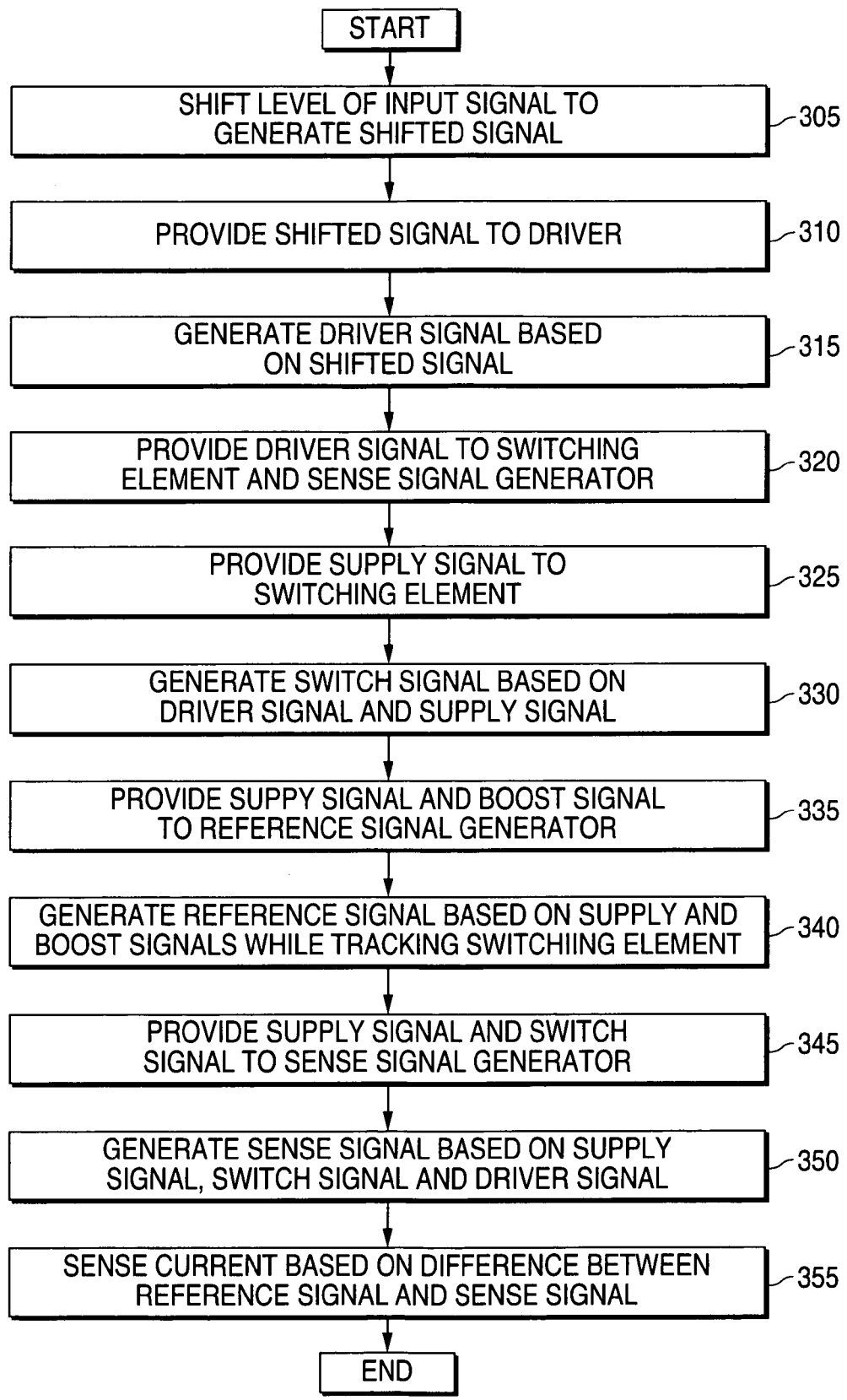
FIG. 3 is a flow diagram illustrating a method for sensing current independently of variations in operating conditions in the integrated power converter of FIG. 1 or 2 in accordance with one embodiment of the present invention.

FIGS. 1 through 3, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged current sensor.

FIG. 1 is a block diagram illustrating an integrated power converter 100 operable to sense current independently of variations in operating conditions in accordance with one embodiment of the present invention. For this embodiment, the integrated power converter 100 comprises a logic and level shifter (LLS) 105, a driver 110, a switching element 115 and a current sensor 120. The current sensor 120 comprises a reference signal generator 130 and a sense signal generator 135. It will be understood that the integrated power converter 100 may comprise other components not illustrated in FIG. 1 without departing from the scope of the present disclosure.

For the illustrated embodiment, the integrated power converter 100 is operable to receive an input signal 150, a supply signal 155, and a boost signal 160. In addition, the integrated power converter 100 is operable to generate a reference signal 165, a sense signal 170, and a switch signal 175.

The LLS 105 is operable to shift the level of the input signal 150 to generate a shifted signal 180. Thus, the shifted signal 180 corresponds to the input signal 150 after adjustment to the appropriate level for the application in which the integrated power converter 100 is implemented. The driver 110, which is coupled to the LLS 105, is operable to drive the switching element 115 and the sense signal generator 135 by generating a driver signal 185 based on the shifted signal.

The switching element 115, which is coupled to the driver 110, is operable to switch on and off based on the driver signal 185 generated by the driver 110. In switching on and off, the switching element 115 is operable to generate the switch signal 175. The current sensor 120 is coupled to the driver 110 and the switching element 115 and is operable to sense an output current of the switching element 115. The current sensor 120 is also operable to pass through the switch signal 175 from the switching element 115 as an output of the integrated power converter 100.

As described in more detail below, the reference signal generator 130 is operable to generate the reference signal 165 for use in sensing current with a high degree of independence to varying operating conditions. The varying operating conditions may comprise temperature, voltage, and process variations. The reference signal generator 130 is operable to generate the reference signal 165 by tracking operating condition variations in the switching element 115. Thus, for example, if a temperature change causes the switching element 115 to operate differently, the reference signal generator 130 operates differently to a similar degree in response to that temperature change. The sense signal generator 135 is operable to generate the sense signal 170. The current sensor 120 is operable to provide the sensed output current of the switching element 115 based on the difference between the sense signal 170 and the reference signal 165. Therefore, because the reference signal generator 130 tracks the switching element 115, the current sensor is operable to sense the output current of the switching element 115 more accurately.

FIG. 2 is a circuit diagram illustrating details of the integrated power converter 100 in accordance with one embodiment of the present invention. For this embodiment, the LLS 105 and the driver 110 are powered by the boost signal 160 and the switch signal 175. The switching element 115 comprises a MOSFET 205. The reference signal generator 130 comprises two MOSFETs 210 and 215, a resistor 220 and a current source 225. The transistor 210 is matched to the transistor 205. The sense signal generator 135 comprises a MOSFET 230 and a resistor 235.

For one embodiment, an external capacitor is coupled between the output of the switch signal 175 and the input of the boost signal 160, and the capacitor is operable to function as a bootstrap capacitor to generate the boost signal 160.

It will be understood that other embodiments of the integrated power converter 100 may also be implemented. For example, the switching element 115 and the current sensor 120 may comprise bipolar junction transistors instead of MOSFETs.

In operation, for the illustrated embodiment, the driver 110 drives the transistor 205, which is the main switching power MOSFET, and the transistor 230. The transistor 230 forms a resistor divider with the resistor 235. The sense signal 170 comprises a voltage at the divider node that represents a ratio voltage difference between the supply signal 155 and the switch signal 175.

When the transistor 205 turns on, a particular amount of output current flows through the transistor 205. This output current causes a voltage drop across the transistor 205 due to the on-resistance of the transistor 205. Thus, a small voltage difference exists between the supply signal 155 and the switch signal 175, which is detected by the current sensor 120. The transistor 230 and the resistor 235 are configured to detect this small voltage difference.

In addition, as described in more detail below, the reference signal generator 130 is configured to set a current limit reference voltage in the form of the reference signal 165 that may be compared to the voltage of the sense signal 170. Thus, in generating the reference signal 165, the reference signal generator 130 sets a maximum voltage difference between the supply signal 155 and the switch signal 175 when the transistor 205 is on. In other words, the reference signal 165 limits the current through the transistor 205.

As a difference between the voltages of the boost signal 160 and the switch signal 175 ($V_{BS\text{-}SS}$) increases, the on-resistances of the transistors 205 and 230 decrease because their gate drive voltages are developed from $V_{BS\text{-}SS}$ (at the driver 110). In addition, the voltage of the sense signal 170 increases with the increase in $V_{BS\text{-}SS}$. The on-resistance of the transistors 205 and 230 also varies with temperature changes.

Thus, to track the transistor 205 with respect to variable operating conditions such as voltage, temperature and process variations, the transistor 210 is matched to the transistor 205. For one embodiment, the transistor 210 is matched to the transistor 205 with its dimensions ratio down. The transistor 215 in this embodiment is a high voltage device with drain extension. The voltage of the reference signal 165 is thus based on the current that is provided by the current source 225 and the variable on-resistance of the transistor 210, resulting in the reference signal 165 changing in a similar manner to the output current of the transistor 205 of the switching element 115.

The switch signal 175 may be held at a voltage relatively close to the voltage of the supply signal 155 when the transistor 205 is on. When the voltage of the boost signal 160 exceeds the supply voltage 155 by approximately one volt, the transistor 215 turns on (because MOSFETs are symmetrical). This results in the transistor 210 being driven by the voltage of the boost signal 160. In addition, the on-resistance of the transistor 210 is proportional to the voltage of the boost signal 160.

Therefore, as $V_{BS\text{-}SS}$ increases, the voltage of the reference signal 165 also increases such that the reference signal 165 tracks $V_{BS\text{-}SS}$. The reference signal 165 also tracks the temperature dependency of the on-resistance of the transistor 205 because the transistor 210 is a ratio mirror of the transistor 205.

During the turn-off cycle of the power stage, the voltage of the boost signal 160 collapses, causing the transistor 215 to turn off. This results in the transistor 210 being driven by the supply signal 155 through the resistor 220. Thus, the reference signal 165 is automatically adjusted to compensate for variations in voltage, temperature and processing.

FIG. 3 is a flow diagram illustrating a method for sensing current independently of variations in operating conditions in the integrated power converter 100 in accordance with one embodiment of the present invention. Although this embodiment corresponds to the integrated power converter 100 illustrated in FIG. 1 or 2, it will be understood that portions of this embodiment may be implemented in any other suitable current sensor without departing from the scope of the present disclosure. In addition, for simplicity, the embodiment of FIG. 3 describes the functionality of each component of the integrated power converter 100 separately. However, it will be understood that each component performs its function in response to receiving signals at the component instead of performing its function in a particular order, as described.

The method begins at step 305 where the LLS 105 shifts the level of an input signal 150 to generate a shifted signal 180. At step 310, the LLS 105 provides the shifted signal 180 to the driver 110. At step 315, the driver 110 generates a driver signal 185 based on the shifted signal 180. At step 320, the driver 110 provides the driver signal 185 to the switching element 115 and the sense signal generator 135. At step 325, a supply signal 155 is provided to the switching element 115. At step 330, the switching element 115 generates a switch signal 175 based on the driver signal 185 and the supply signal 155.

At step 335, the supply signal 155 and a boost signal 160 are provided to the reference signal generator 130. At step 340, while tracking the switching element 115, the reference signal generator 130 generates a reference signal 165 based on the supply signal 155 and the boost signal 160.

At step 345, the switching element 115 provides the switch signal 175 to the sense signal generator 135, and the supply signal 155 is also provided to the sense signal generator 135. At step 350, the sense signal generator 135 generates a sense signal 170 based on the supply signal 155, the switch signal 175 and the driver signal 185. At step 355, the current sensor 120 senses an output current for the switching element 115 based on a difference between the reference signal 165 and the sense signal 170.

Although the present invention has been described with several embodiments, various changes and modifications may be suggested to one skilled in the art. It is intended that the present invention encompass such changes and modifications as fall within the scope of the appended claims.

What is claimed is:

1. A method for sensing current independently of variations in operating conditions, comprising:
    generating a switch signal at a switching element using a driver coupled to the switching element and a current sensor, the driver operable to drive the switching element;
    generating a reference signal at a reference signal generator, the reference signal generator operable to track the switching element;
    generating a sense signal based on the switch signal using the driver;

sensing an output current of the switching element based on a difference between the reference signal and the sense signal; and shifting an input signal to generate a shifted signal using a logic and level shifter (LLS) coupled to the driver, wherein the driver drives the switching element and the sense signal generator based on the shifted signal.

2. The method of claim 1, the switching element comprising a first transistor and the reference signal generator comprising a second transistor, the reference signal generator operable to track the switching element based on the second transistor being matched to the first transistor.

3. The method of claim 2, generating the reference signal comprising generating the reference signal based on an on-resistance of the second transistor.

4. The method of claim 2, the first transistor comprising a MOSFET and the second transistor comprising a MOSFET.

5. The method of claim 3, the reference signal generator further comprising a current source, and generating the reference signal based on the on-resistance of the second transistor further comprising generating the reference signal based on a current generated by the current source.

6. The method of claim 1, the reference signal operable to limit the output current of the switching element.

7. A system for sensing current independently of variations in operating conditions, comprising:
- a switching element operable to generate a switch signal;
- a current sensor coupled to the switching element, the current sensor comprising a reference signal generator operable to track the switching element and to generate a reference signal and a sense signal generator operable to generate a sense signal based on the switch signal, the current sensor operable to sense an output current of the switching element based on a difference between the reference signal and the sense signal;
- a driver coupled to the switching element and the current sensor, the driver operable to drive the switching element and the sense signal generator; and
- a logic and level shifter (LLS) coupled to the driver, the LLS operable to shift an input signal to generate a shifted signal and to provide the shifted signal to the driver, the driver further operable to drive the switching element and the sense signal generator based on the shifted signal.

8. The system of claim 7, the switching element comprising a first transistor and the reference signal generator comprising a second transistor, the reference signal generator operable to track the switching element based on the second transistor being matched to the first transistor.

9. The system of claim 8, the reference signal generator operable to generate the reference signal based on an on-resistance of the second transistor.

10. The system of claim 8, the first transistor comprising a MOSFET and the second transistor comprising a MOSFET.

11. The system of claim 9, the reference signal generator further comprising a current source, and the reference signal generator further operable to generate the reference signal based on a current generated by the current source.

12. A system for sensing current independently of variations in operating conditions, comprising:
- a switching element comprising a first transistor, the switching element operable to generate a switch signal;
- a current sensor coupled to the switching element, the current sensor comprising (i) a reference signal generator comprising a second transistor matched to the first transistor, the reference signal generator operable to generate a reference signal, and (ii) a sense signal generator comprising a third transistor, the sense signal generator operable to generate a sense signal based on the switch signal, the current sensor operable to sense an output current of the switching element based on a difference between the reference signal and the sense signal;
- a driver coupled to a gate of the first transistor and a gate of the third transistor and operable to drive the gates of the first and third transistors; and
- a logic and level shifter (LLS) coupled to the driver, the LLS operable to shift an input signal to generate a shifted signal and to provide the shifted signal to the driver, the driver further operable to drive the gates of the first and third transistors based on the shifted signal.

13. The system of claim 12, the reference signal generator operable to generate the reference signal based on an on-resistance of the second transistor.

14. The system of claim 13, the reference signal generator further comprising a current source, and the reference signal generator further operable to generate the reference signal based on a current generated by the current source.

15. The system of claim 12, the first transistor comprising a MOSFET, the second transistor comprising a MOSFET, and the third transistor comprising a MOSFET.

16. A system for sensing current independently of variations in operating conditions, comprising:
- a switching element comprising a first transistor, the switching element operable to generate a switch signal;
- a current sensor coupled to the switching element, the current sensor comprising (i) a reference signal generator comprising a second transistor matched to the first transistor, the reference signal generator operable to generate a reference signal, and (ii) a sense signal generator comprising a third transistor, the sense signal generator operable to generate a sense signal based on the switch signal, the current sensor operable to sense an output current of the switching element based on a difference between the reference signal and the sense signal;
- a driver coupled to the switching element and the current sensor, the driver operable to receive a boost signal and the switch signal and to generate a driver signal for the first transistor and the third transistor;
- the reference signal generator further comprising a current source, a fourth transistor, and a first resistor, the fourth transistor having a gate operable to receive a supply signal, a drain coupled to the first resistor and to a gate of the second transistor, and a source operable to receive the boost signal, the second transistor having a drain operable to receive the supply signal and a source coupled to the current source, the first resistor operable to receive the supply signal, the reference signal generator operable to generate the reference signal at the source of the second transistor;
- the sense signal generator further comprising a second resistor coupled to a drain of the third transistor and operable to receive the supply signal, the third transistor having a gate coupled to the driver and a source operable to receive the switch signal, the sense signal generator operable to generate the sense signal at the drain of the third transistor; and
- the first transistor having a drain operable to receive the supply signal, a source operable to generate the switch signal, and a gate coupled to the driver.

* * * * *